United States Patent
Crotzer et al.

(10) Patent No.: US 6,348,659 B1
(45) Date of Patent: Feb. 19, 2002

(54) RESILIENT ELECTRICAL INTERCONNECTS HAVING NON-UNIFORM CROSS-SECTION

(75) Inventors: David Crotzer, Nashua, NH (US); David DeDonato, Hopedale, MA (US); Jonathan Goodwin, Braintree, MA (US); Stephen Delprete, Rehoboth, MA (US)

(73) Assignee: Thomas & Betts International, Inc., Sparks, NV (US)

( * ) Notice: Subject to any disclaimer, the term of this patent is extended or adjusted under 35 U.S.C. 154(b) by 0 days.

(21) Appl. No.: 09/227,164

(22) Filed: Jan. 7, 1999

(51) Int. Cl.⁷ .................................................. H01B 3/14
(52) U.S. Cl. ....................... 174/68.1; 257/775; 361/767; 361/773; 361/776
(58) Field of Search ................................. 174/68.1, 260, 174/267; 361/767, 768, 770, 773, 776, 782, 783; 257/780, 775; 439/66, 67

(56) References Cited

U.S. PATENT DOCUMENTS

| | | | |
|---|---|---|---|
| 3,521,128 A | * 7/1970 | Oates | 317/101 |
| 3,776,820 A | * 12/1973 | Johnson et al. | 204/15 |
| 3,971,610 A | * 7/1976 | Buchoff et al. | 339/17 R |
| 5,306,558 A | 4/1994 | Takahashi et al. | 428/331 |
| 5,417,577 A | 5/1995 | Holliday et al. | 439/91 |
| 5,531,021 A | * 7/1996 | Kolman et al. | 29/843 |
| 5,599,193 A | 2/1997 | Crotzer | 439/66 |
| 6,056,557 A | * 5/2000 | Crotzer et al. | 439/66 |

FOREIGN PATENT DOCUMENTS

| | | | |
|---|---|---|---|
| CH | 570 712 | 12/1975 | |
| WO | WO 90/11629 | 10/1990 | 439/66 |

OTHER PUBLICATIONS

Tecknit, Conductive Elastromeric Connector; Jul. 1974.

* cited by examiner

Primary Examiner—Dean A. Reichard
Assistant Examiner—W. David Walkenhorst
(74) Attorney, Agent, or Firm—Weingarten, Schurgin, Gagnebin & Lebovici LLP

(57) ABSTRACT

Resilient electrical interconnects are provided which have a non-uniform cross section which achieves an increased range of deflection and a predetermined relationship between compression force and deflection of the interconnect, and between resistance and deflection of the interconnect. A smaller cross sectional area decreases the spring rate, or compression force, of the interconnect during compression. Increased range of deflection and reduced spring rate enables improved compensation for surface irregularities and facilitates mounting of integrated circuit or other devices having large arrays of interconnects. The non-uniform cross section is provided by a single or compound slope, or alternatively a nonlinear curve, from the end of smaller cross-section to the end of larger cross-section.

16 Claims, 7 Drawing Sheets

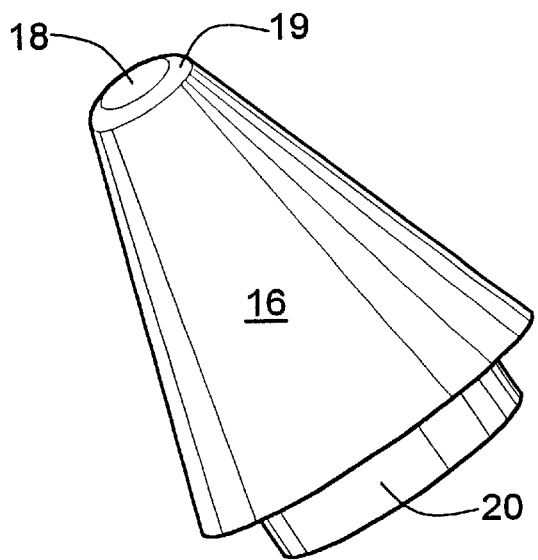
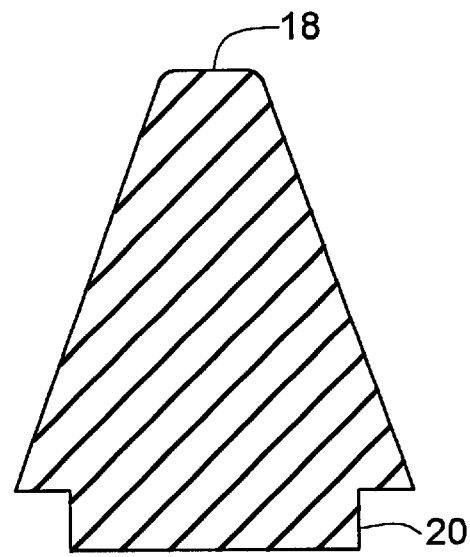
FIG. 2a  FIG. 2b
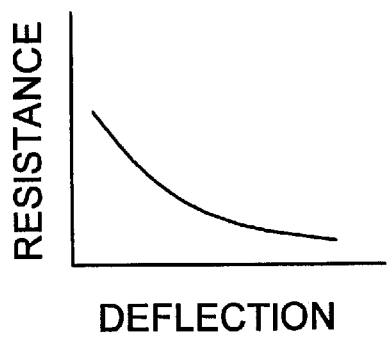
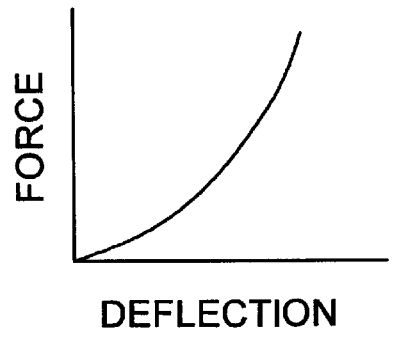
FIG. 2c  FIG. 2d

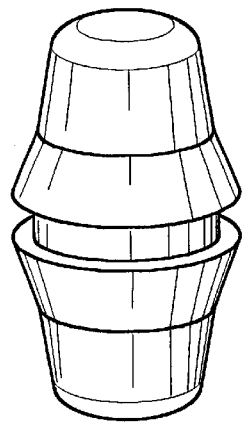
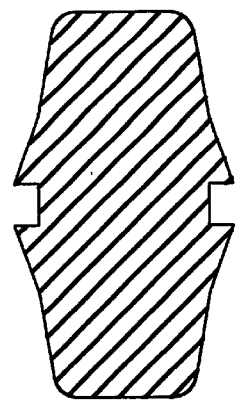
FIG. 8a  FIG. 8b
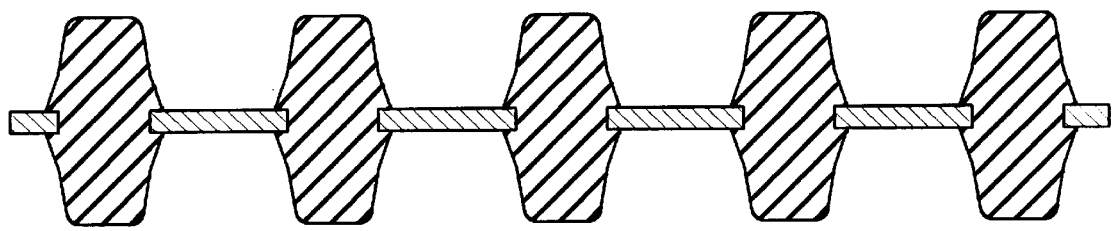
FIG. 8c
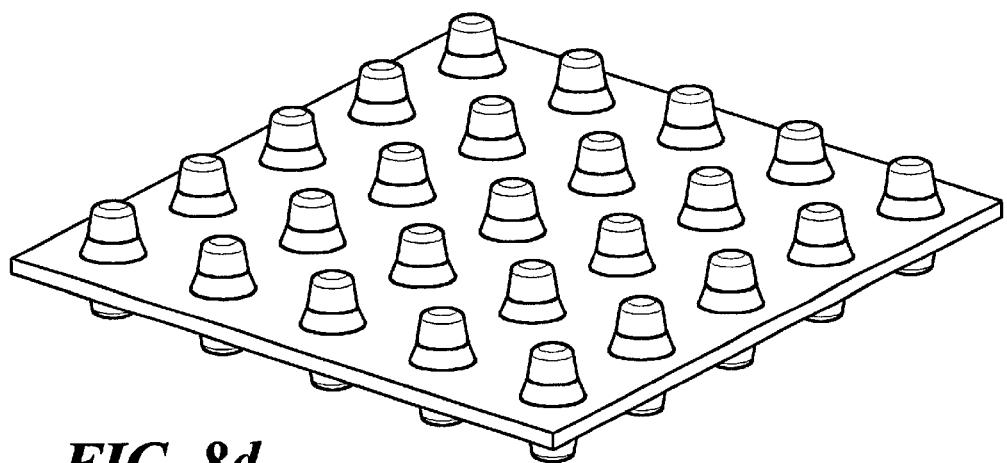
FIG. 8d

RESILIENT ELECTRICAL INTERCONNECTS HAVING NON-UNIFORM CROSS-SECTION

CROSS REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

This invention relates generally to electrical interconnection devices, and more particularly to resilient electrical interconnection devices.

Resilient interconnects that provide electrical connection between opposing planar surfaces are known, and generally comprise an elastomeric or polymeric material containing conductive particles disposed in the material to provide a conductive path between a first surface and a second surface. In one version the interconnects are shaped as elongated columns providing a conductive path between the end faces or surfaces thereof, as shown in co-pending application Ser. No. 08/736,830, filed Oct. 28, 1996 now U.S. Pat. No. 5,949,029, issued Sep. 7, 1999.

Such resilient interconnects can be used to provide electrical connection between a printed circuit board and an integrated circuit or other device. For such a use, the resilient interconnects are disposed in respective openings in a substrate which are arranged in a predetermined pattern. Such a substrate can be a circuit board itself or a separate substrate attachable to a circuit board. The integrated circuit or other device has an array of contacts that correspond to the pattern of resilient interconnects disposed in the substrate. The integrated circuit or other device is mounted in the substrate by aligning the contacts with the resilient interconnects, applying force against the integrated circuit or device so that the resilient interconnects are compressed against the contacts, and then securing the integrated circuit or device to maintain intended contact force.

Complications may occur when a relatively large array of resilient interconnects is employed. Because each resilient interconnect must be deflected to a sufficient degree to establish and maintain electrical connection, the amount of force required to seat the integrated circuit or other device on the printed circuit board increases in proportion to the number of resilient interconnects that are employed. The amount of force that is required may hinder assembly. Further, as the number of interconnects employed is increased, there is an increased risk that satisfactory connection will not be established with all the interconnects, especially where a mating circuit board surface is warped or irregular. In some instances, the resistant interconnects will not be sufficiently compressed to make electrical contact or proper electrical contact, while in other instances the resilient interconnects may be excessively compressed such that misalignment can occur. The misalignment of a resilient interconnect and a mating contact can result in improper engagement of the interconnect with an adjacent contact or short circuiting of one or more contacts.

BRIEF SUMMARY OF THE INVENTION

In accordance with the present invention, resilient electrical interconnects are provided which have a non-uniform cross section which achieves an increased range of deflection and a predetermined relationship between compression force and deflection of the interconnect, and between resistance as a function of deflection. A smaller cross sectional area decreases the spring rate, or compression force, of the interconnect during compression. Increased range of deflection and reduced spring rate enables improved compensation for surface irregularities and facilitates mounting of integrated circuit or other devices having large arrays of interconnects. The non-uniform cross section is provided by a single or compound slope, or alternatively a nonlinear curve, from the end of smaller cross-section to the end of larger cross-section.

Various embodiments as disclosed herein encompass shapes of tapered columns having a straight line contour along the entire height, a contour following a plurality of straight lines at different angles, and a contour following a curve. Conductive material used to make the interconnect, such as a polymeric material with conductive particles, provide the necessary conductivity between the opposed ends of the interconnect. The end of the interconnect having the larger cross-section provides a base for mounting on a fixed contact surface, such as a circuit board or socket, while the end having the smaller cross section provides a contact end for contacting a conductive pad or terminal on the mating device. The broader base stabilizes the interconnect and maintains alignment of the contact end to minimize lateral movement of the interconnect to avoid adjacent interconnects from contacting each other or from contacting an incorrect conductive pad on the mating device.

BRIEF DESCRIPTION OF THE SEVERAL VIEWS OF THE DRAWING

The invention will be more fully understood in view of the Detailed Description of the Invention, and the Drawing of which:

FIG. 2a is a pictorial view of one embodiment of a resilient electrical interconnect;

FIG. 2b is a side view of the embodiment of FIG. 2a;

FIG. 2c is a curve of the resistance vs. deflection characteristic of the embodiment of FIGS. 2a and 2b;

FIG. 2d is a curve of force vs. deflection for the embodiment of FIG. 2a and 2b;

FIG. 3b is a side view of the embodiment of FIG. 3a;

FIG. 4b is a side view of the embodiment of FIG. 4a;

FIG. 5b is a side view of the embodiment of FIG. 5a;

FIG. 8a is another embodiment of a double ended version of the invention;

FIG. 8b is a sectional side view of the embodiment of FIG. 8a;

FIG. 8c is a sectional side view of the embodiment of FIG. 8a mounted in a substrate;

FIG. 8d is a pictorial view of the embodiment of FIG. 8a mounted in a substrate;

FIG. 9b is a sectional side view of the embodiment of FIG. 9a; and

DETAILED DESCRIPTION OF THE INVENTION

Figure 1A:
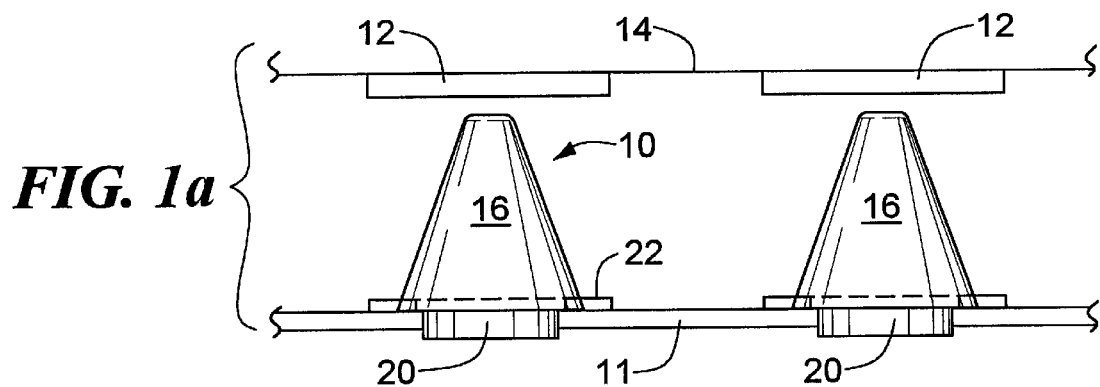
FIG. 1a is a side view that illustrates resilient electrical interconnects in accordance with the invention.

Referring to FIG. 1a resilient electrical interconnects 10 are mounted on a substrate 11 such as a printed circuit board for providing electrical interconnection between mating contacts of the substrate 11 and conductive areas 12 of an integrated circuit 14 or other device. Each interconnect 10 is formed of a resilient non-conductive material such as a polymeric material having conductive particles dispersed therethrough to provide an intended level of conductivity. Each interconnect includes a body 16 of truncated conical shape having a top area of smaller cross-section terminating in a contact surface 18 and a larger base area from which extends a mounting stem 20. The mounting stem 20 is inserted in a hole provided in substrate 11 and the bottom surface of the body 10 is disposed on the confronting surface of the substrate surrounding the hole. The stem 20 is sized in relation to the associated hole to be press fit into the hole for retention of the body 10 on the substrate. The substrate has conductive areas 22 on a surface thereof on which the bottom surface of body 16 is supported in mechanical and electrical contact. The mounting holes in the substrate may have plated walls to also electrically contact the stem portion of the interconnect disposed therein. Preferably the body is chemically bonded to the conductive areas of the substrate or plated hole to provide good electrical connection.

The composition of the resilient electrical interconnects can be as disclosed in co-pending application Ser. No. 08/736,830 filed Oct. 28, 1996, now U.S. Pat. No. 5,949,029, and issued Sep. 7, 1999 and incorporated herein by reference. The interconnects can also be of other conductive resilient compositions, for example a thermoplastic elastomer having carbon particles disposed therein.

Figure 1B:
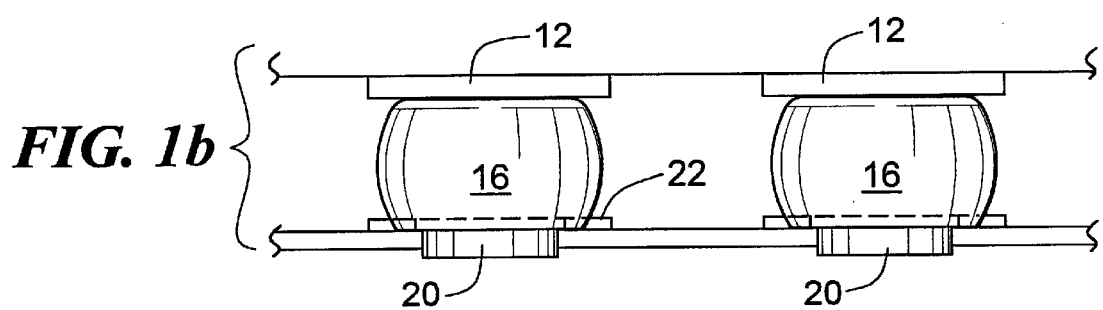
FIG. 1b is a side view that illustrates the interconnects of FIG. 1a in a deflected state.

In FIG. 1a, the interconnects 10 are illustrated prior to electrical engagement with the mating contacts 12. To provide electrical engagement, the interconnects are brought into engagement with the mating contacts and are retained in contact engagement by suitable mechanical fixturing which is usually part of an interconnect socket which can take a variety of configurations known to the art. When engaged the interconnects 10 are compressed as illustrated in FIG. 1b to provide electrical connection between contacts 12 of the integrated circuit or other device and the contacts 22 of the substrate.

Figure 1C:
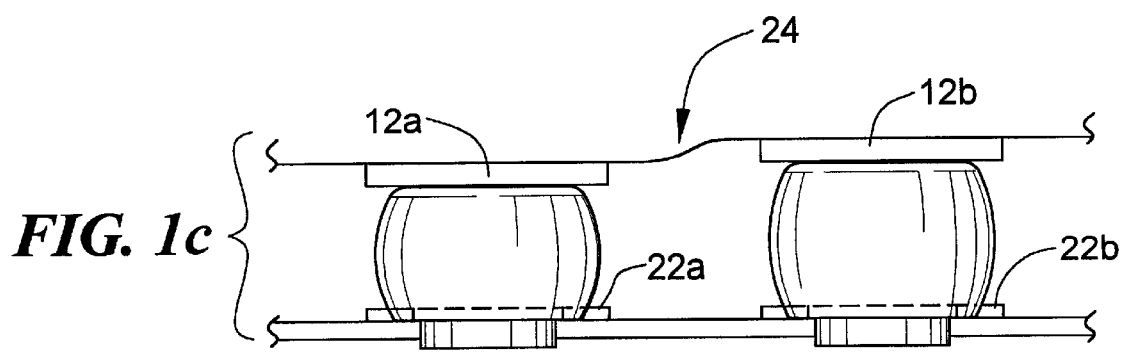
FIG. 1c is a side view that illustrates contact pads attached to an uneven contact surface.

The resilient electrical interconnects have a range of deflection sufficient to provide proper contact engagement with mating contacts without introducing excessive force on the interconnects or the mating contacts which could have deleterious results such as unwanted lateral deflection of the interconnects and misalignment of the interconnects in relation to the mated contacts. The distance between upper and lower contacts to be interconnected via the resilient interconnect can vary due to warped or irregular circuit boards or other substrates as shown in FIG. 1c. The upper contact 12a is spaced from lower contact 22a by a distance less than the distance separating contacts 12b and 22b. The difference in separation distance can be caused for example by a warped or bent circuit board as depicted in exaggerated form by reference 24.

The range of deflection provided by the interconnects of the present invention having non-uniform cross-section is greater than a resilient interconnect of uniform cross-section while maintaining an acceptable range of compressive forces for providing the contact engagement.

The height, cross-sectional area and contour of the interconnect body between the upper and lower contact surfaces can be specified to provide an intended electrical resistance vs. deflection characteristic and force vs. deflection characteristic.

FIG. 2a and 2b illustrate a conically shaped resilient electrical interconnect similar to that shown in FIG. 1a. The taper of the conical surface and the height and width of the body can be dimensioned to suit particular operational requirements. A radiussed area 19 can join the contact end 18 and the tapered body. A typical resistance vs. deflection curve for this embodiment is shown in FIG. 2c. A typical force vs. deflection curve is shown in FIG. 2d.

Figure 3A:
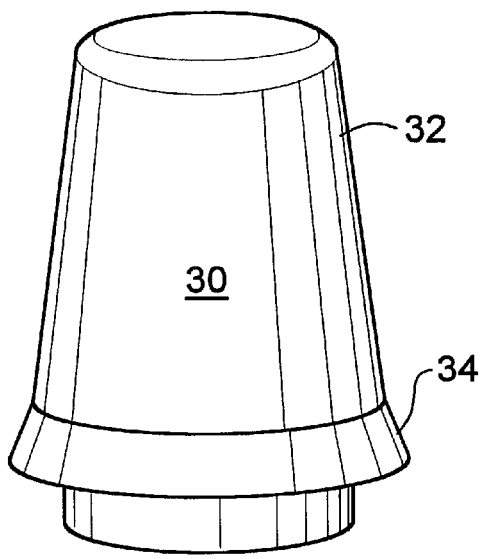
FIG. 3a is a pictorial view of a second embodiment of the invention.
Figure 3B:
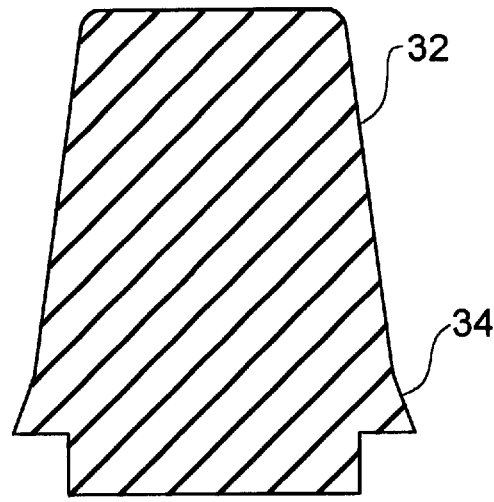
Figure 3C:
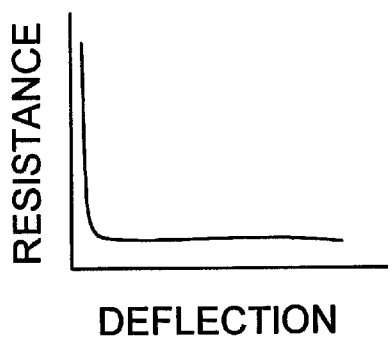
FIG. 3c is a curve of resistance vs. deflection for the embodiment of FIGS. 3a and 3b.
Figure 3D:
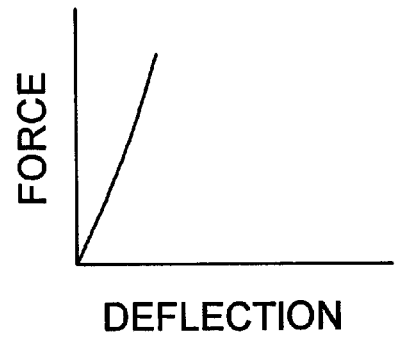
FIG. 3d is a curve of force vs. deflection for the embodiment of FIGS. 3a and 3b.

In FIGS. 3a and 3b there is shown a resilient interconnect having a truncated conical body of two different slopes. The body 30 has a taller upper portion 32 of one slope and a shorter base portion 34 of greater slope. The compound sloped surfaces of the interconnect body 30 provide a relatively steep force vs. deflection characteristic as shown in FIG. 3d. The resistance vs. deflection curve is shown in FIG. 3c which depicts the resistance quickly declining from an initial value to its final value with a relatively small amount of deflection. The relatively broader area of the base portion 34 of the body 30 provides a stable interconnect structure which can accommodate relatively large deflection without excessive force being imposed.

Figure 4A:
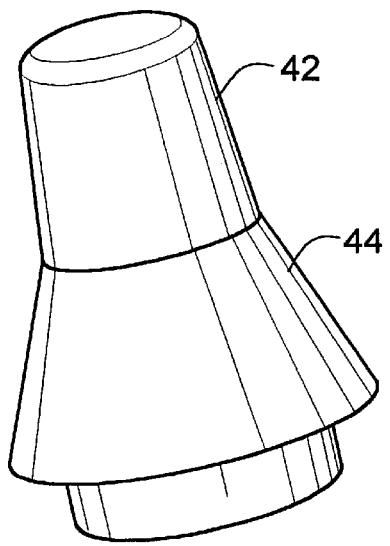
FIG. 4a is a pictorial view of a third embodiment of the invention.
Figure 4B:
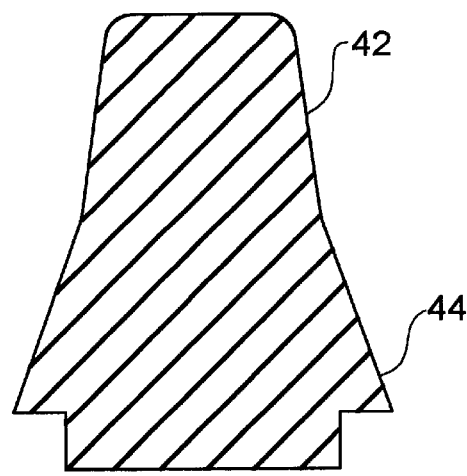
Figure 4C:
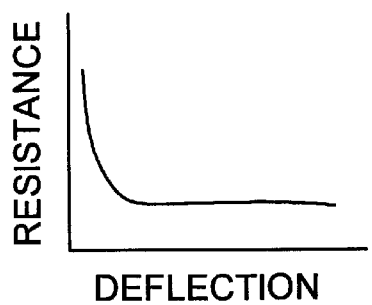
FIG. 4c is a curve of resistance vs. deflection for the embodiment of FIGS. 4a and 4b.
Figure 4D:
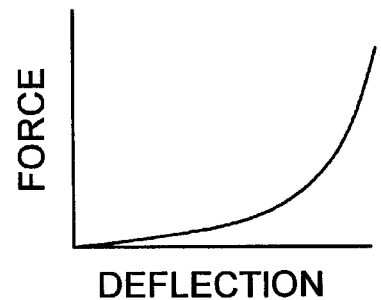
FIG. 4d is a curve of force vs. deflection for the embodiment of FIGS. 4a and 4b.

Another resilient interconnect having compound sloped surfaces is shown in FIGS. 4a and 4b in which the upper portion 42 and lower portions 44 are of approximately equal height. The resistance vs. deflection characteristic is depicted in FIG. 4c, and the force vs. deflection characteristic is depicted in FIG. 4d.

Figure 5A:
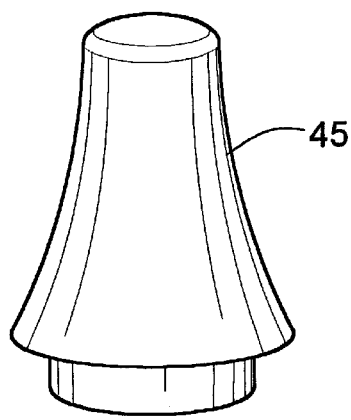
FIG. 5a is a pictorial view of another embodiment of the invention having a curved wall.
Figure 5B:
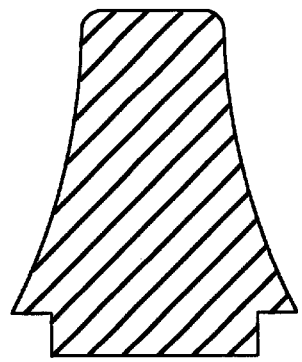

Another embodiment of the resilient interconnect is shown in FIGS. 5a and 5b wherein the interconnect body has a curved surface 45 which provides a smoother force vs. deflection characteristic and which can provide more evenly distributed forces within the body during compression.

Figure 6:
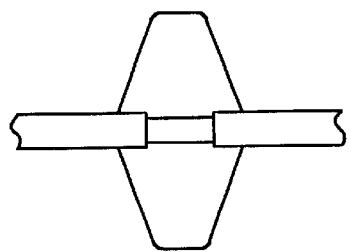
FIG. 6 is a cutaway side view of an embodiment employing a pair of interconnects in accordance with the invention.

A pair of interconnects can also be provided in an opening of a substrate and extending in opposite directions as shown in FIG. 6. The base area of each interconnect is in electrical engagement with a conductive surface area on the substrate. The stem portions of the interconnects can also be in electrical engagement with a conductive wall of a plated through hole in the substrate, as noted above.

Figure 7A:
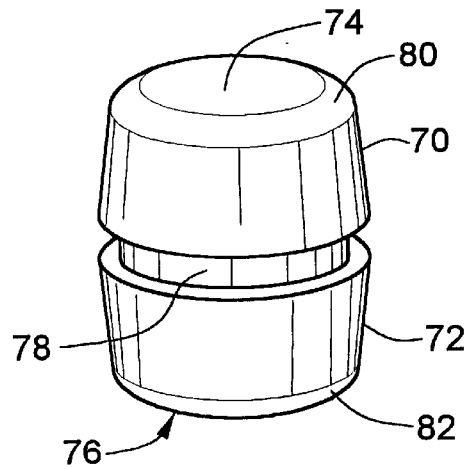
FIG. 7a illustrates a double ended version of a resilient interconnect in accordance with the invention.
Figure 7B:
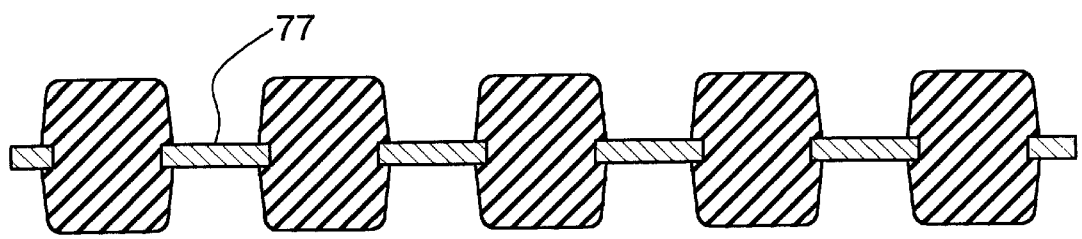
FIG. 7b is a cutaway side view of the embodiment of FIG. 7a mounted in a substrate.
Figure 7C:
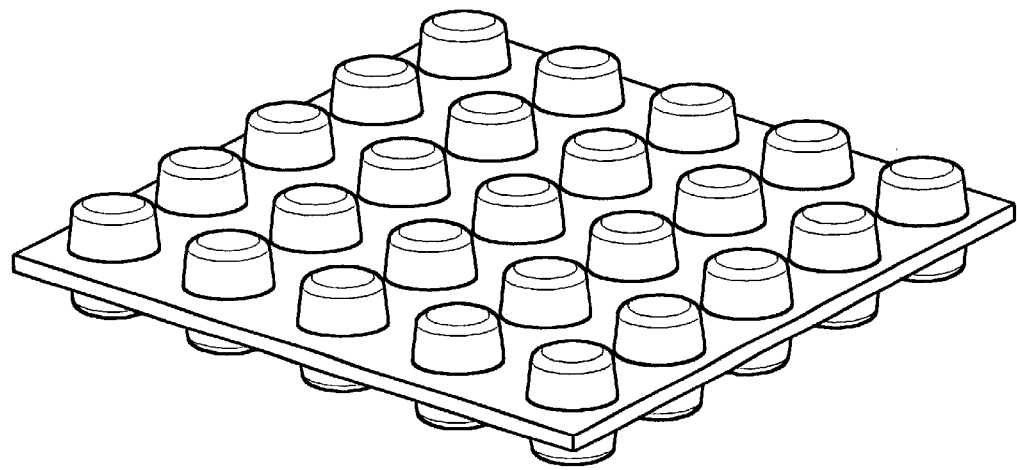
FIG. 7c is a pictorial view of the embodiment of FIG. 7a mounted in a substrate.

The interconnect can also be formed in a double ended version as shown in FIG. 7a. Each portion of the interconnect is of truncated conical form. The upper portion 70 terminates in contact surface 74, and the lower portion 72 terminates in contact surface 76. An intermediate portion 78 is of reduced cross-sectional area and is sized to be accommodated within a corresponding opening in a substrate 77 as shown in FIGS. 7b and 7c. The tapered body portions 70 and 72 are joined to the surface areas by intermediate beveled peripheries 80 and 82. The resistance and force characteristics as a function of deflection are generally similar to the characteristic curves shown in FIG. 3c and 3d.

The resilient interconnects are typically arranged in an array mounted on a substrate, as shown in FIG. 7c, which corresponds to the array of contacts of a mating device.

FIGS. 8a and 8b show another double ended version of an interconnect, this version having compound tapered surfaces similar to the compound version shown in FIG. 3a and FIG. 4a above. These are similarly mounted on a substrate as shown in FIG. 8c and 8d.

Figure 9A:
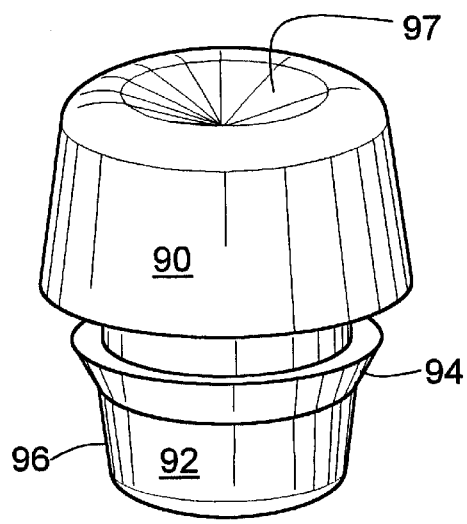
FIG. 9a is a pictorial view of yet another embodiment of the invention.
Figure 9B:
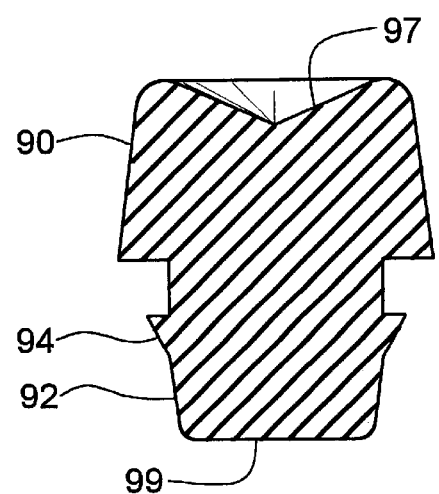
Figure 9C:
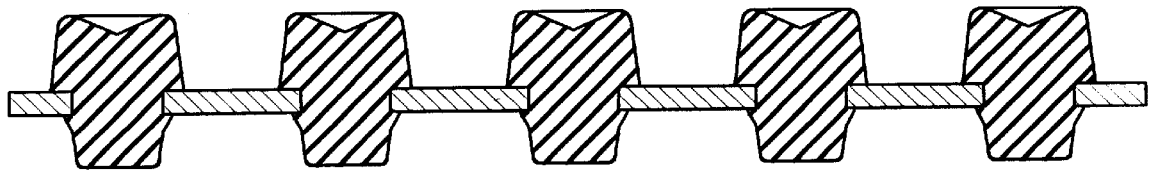
FIG. 9c is a sectional side view of the embodiment of FIG. 9a mounted in a substrate.

Another embodiment is shown in FIGS. 9a and 9b in which the upper end 90 of the interconnect is larger than the lower end 92. The upper end 90 is of truncated conical shape having a single slope. The lower end 92 has a compound conical slope defined by broader portion 94 and narrower portion 96. The interconnect is mounted on a substrate as shown in FIG. 9c. The upper end has a conical contact area 92, and the bottom end has a planar contact area 99.

The interconnects can be individually molded or otherwise formed and installed into respective openings of a substrate such as by press fitting the resilient elements into the substrate openings. Alternatively the resilient interconnects can be integrally molded or otherwise formed in the substrate to provide an interconnection array of intended configuration for particular purposes.

The contact surfaces of the interconnects may be of planar configuration as shown above, or may be of other configurations to mate with particular types of contacts, such as a conical contact area to engage a ball contact of a ball grid array. The resilient interconnect contact areas can be of other forms as may be desired to suit specific purposes.

Having the described the preferred embodiments of the invention, other embodiments which incorporate concepts of the invention will now become apparent to those skilled in the art. Therefore, the invention should not be viewed as limited to the disclosed embodiment but rather should be viewed as limited only by the spirit and scope of the appended claims.

What is claimed is:

1. A resilient conductive interconnect element for providing electrical connection between a first surface and a second surface, said conductive interconnect element comprising:
    a body of conductive elastomeric material having a non-uniform cross section, providing a current path through said body, wherein said body has a tapered shape of at least two different slopes, in which the greatest slope is at a smaller end of the taper;
    a first contact area on said smaller end of said taper having a substantially flat contact surface; and
    a second contact area on another end of the body having a substantially flat contact surface;
    whereby a conductive path is provided through the body between the first and second contact surfaces and said end with said greatest slope is greater than at least 50% of the body.

2. A resilient conductive interconnect element for providing electrical connection between a first surface and a second surface, said conductive interconnect element comprising:
    a body of conductive elastomeric material having a non-uniform cross section adapted to pass current through said body;
    a first contact area on one end of the body;
    a radiused area joining said first contact area and a remainder of said body; and
    a second contact area on another end of the body.

3. The resilient conductive interconnect element of claim 2 wherein said elastomeric material is a thermoplastic elastomer having carbon particles disposed therein.

4. The resilient conductive interconnect element of claim 2 wherein said body has a tapered shape and wherein the first contact area is at the smaller end of the taper, wherein a larger end stabilizes said element and maintains alignment of said body to minimize lateral movement of said first contact area.

5. The resilient conductive interconnect of claim 2 wherein the body has a tapered shape of at least two different slopes, in which the greatest slope is at a top portion of the body toward the first contact area and said top portion is approximately the same height as a bottom portion.

6. The interconnect of claim 5 wherein said top portion is at least twice the height of said bottom portion.

7. The interconnect of claim 2 wherein said first contact area exhibits an indented contact area.

8. The interconnect of claim 7 wherein said indented contact area is an indented conical contact area.

9. The resilient conductive interconnect of claim 2 wherein said body has a concave curved wall extending from one end, being a smaller end, to said another end, being a larger end, said smaller end terminating in the first contact area.

10. A resilient conductive interconnect element for providing electrical connection between a first surface and a second surface, said conductive interconnect element comprising:
    a body of conductive elastomeric material having a non-uniform cross section providing a current path through said body wherein the body comprises:
        a first body portion having a first non-uniform cross section;
        a first contact area on one end of said first body portion;
        a first radiused area joining said first contact area and said first body portion, wherein said first contact area has a smaller cross section than a smallest portion of said first body portion;
        a second body portion of a second cross section, said second body portion joining said first body portion and a third body portion, said third body portion having a second non-uniform cross section;
        a second contact area on one end of said third body portion; and
        a second radiused area joining said second contact area and said third body portion, wherein said second contact area has a smaller cross section than a smallest portion of said third body portion.

11. The interconnect of claim 10 wherein said first and third body portions have a tapered shape.

12. The interconnect of claim 11 wherein said tapered shape has at least two different slopes, in which the greatest slope is on a portion of said first and third body portions closest to said first and second contact areas respectively.

13. The interconnect of claim 11 wherein said third body portion has a tapered shape of at least two different slopes, in which the greatest slope is on a portion of said third body portion closest to said second contact area.

14. The interconnect of claim 10 wherein said first and third body portions have a concave curved wall extending from a smaller end near the respective contact areas to a larger end near the junction of the respective body portion and the second body portion.

15. The interconnect of claim 10 wherein said first body portion and said third body portions are approximately identical.

16. The interconnect of claim 10 wherein said third body portion is smaller than said first body portion while having a larger cross section than said second body portion.

* * * * *